US010772174B2

(12) United States Patent
Weaver

(10) Patent No.: US 10,772,174 B2
(45) Date of Patent: *Sep. 8, 2020

(54) RECALIBRATION OF A TUNABLE LAMP SYSTEM

(71) Applicant: LUMENETIX, LLC, Scotts Valley, CA (US)

(72) Inventor: Matthew D. Weaver, Aptos, CA (US)

(73) Assignee: Lumenetix, LLC, Scotts Valley, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/208,242

(22) Filed: Dec. 3, 2018

(65) Prior Publication Data
US 2019/0297703 A1  Sep. 26, 2019

Related U.S. Application Data

(60) Continuation of application No. 15/481,770, filed on Apr. 7, 2017, now Pat. No. 10,149,365, which is a
(Continued)

(51) Int. Cl.
G01J 5/60 (2006.01)
G01J 3/28 (2006.01)
(Continued)

(52) U.S. Cl.
CPC ............. H05B 45/22 (2020.01); G01J 3/28 (2013.01); G01J 3/465 (2013.01); G01J 5/60 (2013.01);
(Continued)

(58) Field of Classification Search
CPC .......... G01J 7/00; G01J 9/00; G01J 2009/006; G01J 2009/0211; G01J 3/28; G01J 3/465;
(Continued)

(56) References Cited

U.S. PATENT DOCUMENTS 6,357,889 B1  3/2002 Duggal et al.
7,753,559 B2  7/2010 Liu
(Continued)

OTHER PUBLICATIONS

Non-Final Office Action with Restriction Requirement dated Oct. 28, 2016 for U.S. Appl. No. 15/137,359 by Weaver, M., filed Apr. 25, 2016.
(Continued)

Primary Examiner — Vibol Tan
(74) Attorney, Agent, or Firm — Lewis Roca Rothgerber Christie LLP

(57) ABSTRACT

Some embodiments include a method of operating a tunable light module. The method can include driving a lamp in the tunable light module, having lamps of at least two colors, to produce a colored light according to the color mixing plan that corresponds to a correlated color temperature (CCT); measuring a light characteristic of the lamp using a light sensor; detecting a degradation level by comparing the measured light characteristic against an expected light characteristic; and adjusting a current level for driving the lamp at the CCT by referencing the color mixing plan and an alternative coefficient corresponding to the degradation level.

18 Claims, 10 Drawing Sheets

Related U.S. Application Data division of application No. 15/137,359, filed on Apr. 25, 2016, now Pat. No. 9,648,696.

(60) Provisional application No. 62/153,953, filed on Apr. 28, 2015.

(51) Int. Cl.

| | | |
|---|---|---|
| *H05B 45/22* | (2020.01) | |
| *H05B 45/10* | (2020.01) | |
| *H05B 45/20* | (2020.01) | |
| *H05B 45/37* | (2020.01) | |
| *H05B 45/50* | (2020.01) | |
| *H05B 47/105* | (2020.01) | |
| *H05B 47/155* | (2020.01) | |
| *G06F 30/20* | (2020.01) | |
| *G01J 3/46* | (2006.01) | |
| *G01J 7/00* | (2006.01) | |
| *G01J 9/00* | (2006.01) | |

(52) U.S. Cl.
CPC . *G01J 7/00* (2013.01); *G01J 9/00* (2013.01); *G06F 30/20* (2020.01); *H05B 45/10* (2020.01); *H05B 45/20* (2020.01); *H05B 45/37* (2020.01); *H05B 45/50* (2020.01); *H05B 47/105* (2020.01); *H05B 47/155* (2020.01); *G01J 2005/608* (2013.01)

(58) Field of Classification Search
CPC .. G01J 2005/608; G01J 5/60; H05B 33/0869; H05B 33/0857; H05B 33/086; H05B 33/0845; H05B 45/22; H05B 47/155; H05B 47/105; H05B 45/50; H05B 45/37; H05B 45/10; F21S 48/215
See application file for complete search history.

(56) References Cited

U.S. PATENT DOCUMENTS

| | | |
|---|---|---|
| 8,172,415 B2 | 5/2012 | Wegh et al. |
| 8,203,260 B2 | 6/2012 | Li et al. |
| 8,337,031 B2 | 12/2012 | Wegh et al. |
| 8,556,438 B2 | 10/2013 | McKenzie et al. |
| 8,624,527 B1 | 1/2014 | Meir et al. |
| 8,773,337 B2 | 7/2014 | Li et al. |
| 8,783,887 B2 | 7/2014 | Caruso et al. |
| 8,796,948 B2 | 8/2014 | Weaver |
| 8,928,249 B2 | 1/2015 | Raj et al. |
| 8,946,998 B2 * | 2/2015 | Edwards ............ H05B 33/0869 315/151 |
| 9,060,409 B2 | 6/2015 | Bowers et al. |
| 9,089,032 B2 | 7/2015 | Bowers et al. |
| 9,142,711 B2 | 9/2015 | McKenzie et al. |
| 9,332,612 B1 | 5/2016 | Weaver |
| 9,458,988 B2 | 10/2016 | Caruso et al. |
| 9,510,416 B2 | 11/2016 | Dias et al. |
| 9,557,016 B2 | 1/2017 | Van Bommel et al. |
| 9,562,671 B2 | 2/2017 | Davis |
| 10,149,365 B2 * | 12/2018 | Weaver ............. H05B 33/0869 |
| 2011/0109445 A1 * | 5/2011 | Weaver ............. H05B 37/0272 340/286.01 |
| 2012/0155076 A1 * | 6/2012 | Li .......................... F21S 8/026 362/231 |
| 2012/0286674 A1 | 11/2012 | Takanashi |
| 2013/0154509 A1 | 6/2013 | Yabe |
| 2013/0221852 A1 * | 8/2013 | Bowers ............. H05B 33/0863 315/131 |
| 2015/0098709 A1 | 4/2015 | Breuer et al. |
| 2015/0145431 A1 | 5/2015 | Ferrier |
| 2015/0382425 A1 | 12/2015 | Lewis et al. |
| 2016/0050723 A1 | 2/2016 | Gochnauer et al. |
| 2016/0066383 A1 | 3/2016 | Dias et al. |
| 2016/0327236 A1 | 11/2016 | Benitez et al. |

OTHER PUBLICATIONS

Notice of Allowance dated Jan. 17, 2017 for U.S. Appl. No. 15/137,359 by Weaver, M., filed Apr. 25, 2016.

* cited by examiner

RECALIBRATION OF A TUNABLE LAMP SYSTEM

CROSS-REFERENCE TO RELATED APPLICATION(S)

This application is a continuation application of U.S. patent application Ser. No. 15/481,770, entitled "RECALIBRATION OF A TUNABLE LAMP SYSTEM," which was filed on Apr. 7, 2017, which is a divisional application of U.S. patent application Ser. No. 15/137,359, entitled "RECALIBRATION OF A TUNABLE LAMP SYSTEM," which was filed on Apr. 25, 2016, which claims the benefit of U.S. Provisional Patent Application No. 62/153,953, entitled "RECALIBRATION OF A TUNABLE LAMP SYSTEM," which was filed on Apr. 28, 2015, both of which are incorporated by reference herein in its entirety.

RELATED FIELD

At least one embodiment of this disclosure relates generally to a tunable lighting system, and in particular to controlling tunable LED-based lamp modules.

BACKGROUND

Conventional systems for controlling lighting in homes and other buildings suffer from many drawbacks. One such drawback is that these systems rely on conventional light sources, such as incandescent bulbs and fluorescent bulbs. Such light sources are limited in many aspects. For example, such light sources typically do not offer long life or high energy efficiency. Further, such light sources offer only a limited selection of colors, and the color or light output of such light sources typically changes or degrades over time as the bulb ages. In systems that do not rely on conventional lighting technologies, such as systems that rely on light emitting diodes ("LEDs"), long system lives are possible and high energy efficiency can be achieved. However, in such systems issues with color quality can still exist.

A light source can be characterized by its color temperature and by its color rendering index ("CRI"). The color temperature of a light source is the temperature at which the color of light emitted from a heated black-body radiator is matched by the color of the light source. The color temperature is useful to emulate different states of natural light produced from the sun. For a light source that does not substantially emulate a black body radiator, such as a fluorescent bulb or an LED, the correlated color temperature ("CCT") of the light source is the temperature at which the color of light emitted from a heated black-body radiator is approximated by the color of the light source. The CRI of a light source is a measure of the ability of a light source to reproduce the colors of various objects faithfully in comparison with an ideal or natural light source. The CCT and CRI of LED light sources are typically difficult to tune and adjust. Further difficulty arises when trying to maintain an acceptable CRI while varying the CCT of an LED light source.

Figure 1A:
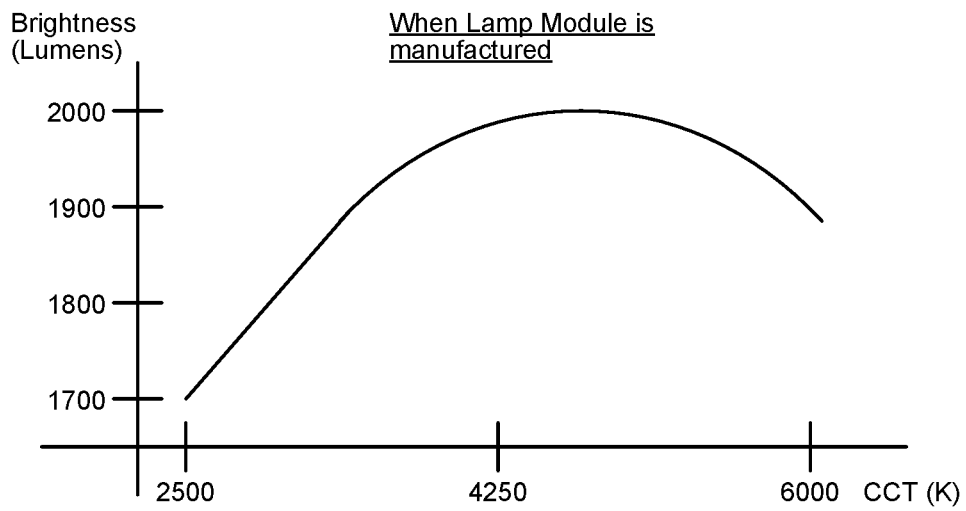
FIG. 1A is a graph illustrating an example of maximum brightness levels at different color temperatures for a tunable light module when the tunable light module prior to deployment, in accordance with various embodiments.

The figures depict various embodiments of this disclosure for purposes of illustration only. One skilled in the art will readily recognize from the following discussion that alternative embodiments of the structures and methods illustrated herein may be employed without departing from the principles of the invention described herein.

DETAILED DESCRIPTION

Disclosed is a system architecture of configuring a lamp system to accurately and consistently produce light in accordance with a user setting. The lamp system can include one or more tunable light modules, such as LED-based lamp modules. The tunable light modules can be independently replaceable.

A tunable light module includes two or more lamps (e.g., LEDs) of at least two colors. Each of the lamps can produce illumination having different spectral distribution (e.g., peaks and valleys at different frequencies). A mixing chamber and/or a light pipe of the tunable light module can mix the light produced from the lamps and emit the mixed illumination (i.e., output illumination) through an exit aperture. A controller of the tunable light module can change characteristics (e.g., color temperature, saturation, hue, brightness, etc.) of the mixed illumination produced from the lamps by referencing a color mixing plan.

A color mixing plan can be a set of associations that specifies how to achieve different characteristics of the output illumination under a given operational condition and given constraints of performance metrics. The set of associations can be stored in any suitable form, such as a reference table (more memory intensive) or a polynomial function (more processor intensive). For example, a color mixing plan can specify driving conditions (e.g., current levels and/or signal patterns, such as different pulse width modulations) for each of the lamps to achieve a color characteristic (e.g., CCT) at a particular operational temperature. In some embodiments, the color mixing plan specifies luminous flux required from each of the lamps to achieve a color characteristic at an operational temperature. The operational condition may include a junction temperature, a mixing chamber temperature, a heat sink temperature, or a combination thereof. The constraints can include an efficacy constraint, an efficiency constraint, a maximum brightness constraint (e.g., per color channel or overall), CRI constraints, or any combination thereof.

The color mixing plan may be generated at a pre-deployment stage of the tunable light module. The pre-deployment stage may refer to the manufacturing stage, the assembly stage, or any time before a merchant ships the tunable light module to customers. For example, the color mixing plan can be generated based on a lamps color space map of the tunable light module. A model builder system can generate the lamps color space map during a pre-deployment stage for a tunable light module. Because of minor differences in material and manufacturing process, not all lamps/LEDs of the same color type produce the same light characteristic under the same driving and/or operational conditions. Furthermore, because of minor geometric configuration differences between LED sets and the variations amongst LEDs of the same color type, tunable light modules might not produce the same light characteristics under the same operating conditions. The lamps color space map can capture the unique characteristic of the LEDs in each tunable light module.

The model builder system includes a spectral analyzer. The lamps color space map may include spectral analysis of each lamp or each color channel under different operational conditions and different driving conditions (e.g., driving current and/or driving signal pattern). The lamps color space map may be generated by driving each lamp or color channel through a range of possible driving conditions and monitoring the spectral characteristics and the operational conditions associated with each driving condition. In some embodiments, the model builder system can also iterate through different operational conditions, such as generating different temperature scenarios externally. The model builder system can save the mapping of the driving conditions corresponding to the operational conditions and the spectral characteristics into the lamps color space map. For example, the lamps color space map can be generated based on the method described in FIG. 2B and stored in a memory device accessible later on after deployment.

The model builder system can index the spectral characteristics of each operational condition and each driving condition for a color channel in a variety of ways. For example, the model builder system can drive one color channel at a time and monitor its spectral characteristics. For another example, the model builder system can drive a first set of color channels including the intended color channel and drive a second set of color channels, that is the first set minus the intended color channel. The difference between the spectral characteristics of the first set and the second set can be stored as the spectral characteristics of the intended color channel.

In some embodiments, the model builder system can also monitor the junction temperature of the lamps (e.g., LEDs) as the model builder system iterates through the range of driving conditions to build a transient temperature map. For example, the model builder system can use the spectral analyzer to estimate the transient junction temperature or use a thermal sensor. Using the temperature map and a model of the thermal capacitance and resistance of materials and structures inside the tunable light module, the model builder system can generate a thermal model that enables the tunable light module to accurately predict its junction temperature or operational temperature. In some embodiments, the thermal model can incorporate both a thermal capacitance and resistance model and a transient temperature model.

The tunable light module may include a temperature sensor. The temperature sensor may not be immediately adjacent to the lamps. However, the thermal model can be used to accurately estimate the junction temperature at the lamps. For example, the temperature measured at the temperature sensor can provide an estimate of the ambient temperature within the tunable light module. The thermal model can be used to estimate the effect of the ambient temperature at the lamps. For example, the thermal capacitance and resistance of the structures can be used to estimate the effect of that ambient temperature. The transient temperature model can further enable the tunable light module to predict the transient temperature in response to the driving conditions. A combination of the estimated transient temperature and the measured ambient temperature can accurately predict the actual junction temperature.

Given a desired spectral characteristic, there may be different permutations of operational conditions that can achieve the same spectral characteristic. For example, there may be multiple different ways to drive three color LEDs to achieve a color temperature of 2200K. The different ways of driving the three color LEDs may differ in performance metrics (e.g., maximum brightness, efficacy, efficiency, and/or CRI). The computing device can use a multivariate solver to optimize the performance metrics to select driving conditions that matches manufacturer specified constraints. For example, the multivariate solver can take the lamps color space map and performance metric constraints as inputs, and produce the optimized color mixing plan as an output.

The optimized color mixing plan is stored in a memory of the tunable light module. In some embodiments, the thermal model is also stored in the memory. In some embodiments, the lamps color space map is also be stored in the memory. In some embodiments, the model builder system can associate the lamps color space map with an identifier of the tunable light module and save the lamps color space map and its associations in a cloud storage system.

The color mixing plan enables the controller of the tunable light module to produce user-specified spectral characteristics on the fly under optimal conditions according to the manufacturer specified constraints. However, the color produced by the tunable light module may shift over time (e.g. a tristimulus shift). This is caused by various reasons, including browning of a LED cap, phosphorus popping of a phosphorus-based LED, the degradation of silicone in an LED or any optical coupling in the tunable light module, other chemical, material or mechanical related degradation, or any combination thereof.

A mobile device can couple to one or more tunable light modules to establish a lamp group. The mobile device can be a general purpose device having an operating system implemented thereon (e.g., by a processor executing executable instructions stored in a memory component). The operating system can enable the mobile device to download, install, implement a light control application thereon.

The light control application provides a user interface (e.g., a touchscreen interface) for a user to configure a tunable light module or the lamp group as a whole. The light control application can control the tunable light modules via wireless protocols (e.g., Bluetooth or WiFi). For example, the tunable light modules can include an integrated communication module therein, or be coupled to an adapter box that receives and interprets the communication from the light control application. The tunable light module has the capability of color matching color spectrums or characteristics (e.g., color temperatures, brightness, and hue) based on the color mixing plan. The light control application can send or schedule commands actively (e.g., based on a user command) or passively (e.g., automatically as a background process without a user command) to activate the color matching process on the tunable light module. The light control application can further receive status information regarding the tunable light module including fault detection, estimated life time, temperature, power consumption, or any combination thereof.

In some embodiments, the light control application can initiate (e.g., automatically or based on a user command) a lamp maintenance process, including re-calibration and data collection. For example, the light control application can communicate (e.g., via WiFi or cellular data plan) with a computer server (e.g., the cloud storage server) that stores light configuration data (e.g., CCT, brightness, saturation, and/or hue) and operating state data (e.g., temperature, current, actual CCT level, or other light characteristic data from sensors of a lamp module) for each of the lamp group or lamp modules. The computer server can re-compute and/or re-optimize a color mixing plan for a lamp module based on the recorded history of operating state data and light configuration data. The computer server can then push the updated color mixing plan back to the lamp module through the mobile device running the light control application. In some embodiments, the computer server, the light control application, the lamp module, or a combination thereof, can maintain the recorded history of configuration data and operating state data of the lamp module.

In some embodiments, instead of controlling the tunable light modules with a general-purpose mobile device, a controller device coupled to the tunable light modules via a wired interconnect can also control the tunable light modules. For example, the controller device can communicate directly through the wired interconnect with an integrated communication module in a tunable light module or indirectly through an adapter box outside of the tunable light module that interprets and/or converts the control signal from the controller device.

Disclosed are different methods of recalibrating the color mixing plan after decalibration due to certain types of degradation. Recalibration can enable the tunable light modules to more accurately produce illumination characteristics as intended (e.g., as commanded by a controller/mobile device). Recalibration of the color mixing plan can also enable the tunable light module to meet existing constraints of performance metrics. For example, the recalibration can enable the tunable light module to meet the same maximum brightness level as before. Conventionally, tunable light modules are set with more lenient constraints (e.g., the tunable light module being capped at a lower brightness level) such that users would not notice a degradation to the performance metric after decalibration. The disclosed methods overcome the necessity of this type of performance capping before deployment.

In some embodiments, during the pre-deployment stage, the model builder system can compute different alternative coefficients (e.g., for a lookup table or a polynomial function) stored in the color mixing plan to adjust the color mixing plan when degradation is detected. These alternative coefficients are calculated based on a set of constraints given at the pre-deployment stage. For example, a tunable light module can include a light sensor (e.g., a PIN diode or a tristimulus sensor). After deployment, the tunable light module can use the light sensor to determine how much degradation occurred in each color channel. The tunable light module can then select an alternative coefficient associated with a color channel based on the degradation level of that color channel to recalibrate.

In some embodiments, the model builder system can compute the alternative coefficients based on the degradation type. For example, a first set of alternative coefficients can correspond to plastic browning and a second set of alternative coefficients can correspond to phosphorus popping. For various types of degradation, the tri-stimulus shift function is relatively stable over time. Accordingly, the model builder system can provide alternative coefficients that correspond to different levels of degradation. The light sensor in the tunable light module can then, in real-time after deployment, determined the degradation level and select the alternative coefficients to use.

In some embodiments, when calibrating after deployment, the tunable light module can monitor brightness levels under pre-determined driving conditions for each color channel. For example, the light module can switch through each color channel under the predetermined driving conditions. The tunable light module can send the brightness levels associated with the predetermined driving conditions to a mobile device. In turn, the mobile device can send the brightness levels associated with the predetermined driving conditions to a cloud server. The cloud server can access the lamps color space map associated with the tunable light module and re-compute the color mixing plan by normalizing or aligning the lamps color space map to the amount of degradation observed in each color channel. The cloud server can re-compute the color mixing plan based on the constraints on the performance metrics set at the pre-deployment stage. The cloud server can also re-compute the color mixing plan based on a new set of constraints on the performance metric. For example, the new set can be specified by the user of the mobile device coupled to the tunable light module. For another example, the new set can be updated by the merchant controlling the cloud server.

In some embodiments, the tunable light module can include a spectral analyzer. In those embodiments, the tunable light module can update the lamps color space map at the deployment stage. For example, the tunable light module can run a background process to spectrally analyze the illumination produced during different driving conditions and operational conditions. The spectral analysis can be updated to the cloud server through the mobile device. The cloud server can then update the lamps color space map based on the new spectral analysis information. In some embodiments, the lamps color space map can be stored on the tunable light module. In those embodiments, the lamps color space map can be updated in real-time on the tunable light module and the color mixing plan can be re-computed using a processor of the tunable light module.

FIG. 1A is a graph 102 illustrating an example of maximum brightness levels at different color temperatures for a tunable light module when the tunable light module prior to deployment, in accordance with various embodiments. The tunable light module can emulate a black body radiator at different color temperatures. The graph 102 illustrates the maximum brightness levels at a range of color temperatures when the tunable light module is driving its color lamps (e.g. LEDs) according to a color mixing plan.

Figure 1B:
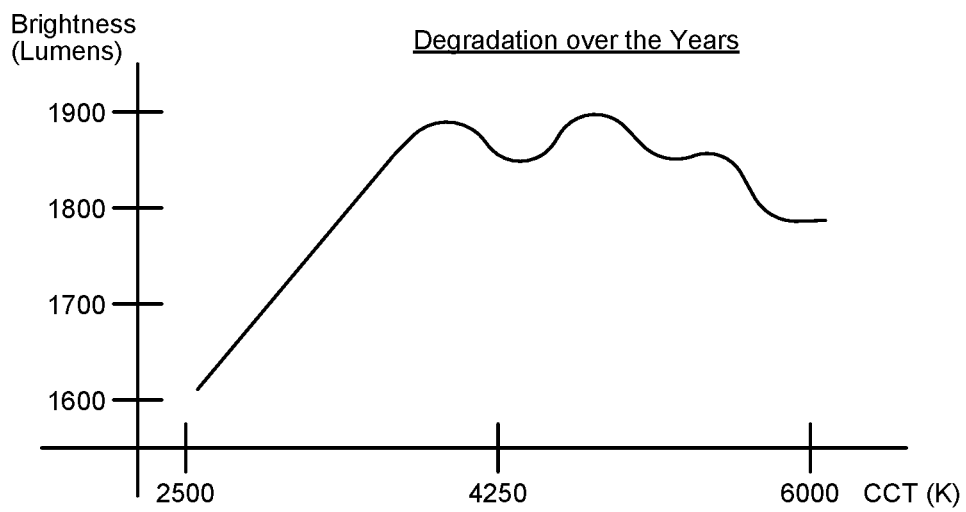
FIG. 1B is a graph illustrating an example of maximum brightness levels at different color temperatures for the tunable light module of FIG. 1A after the tunable light module experiences degradation, in accordance with various embodiments.

FIG. 1B is a graph 104 illustrating an example of maximum brightness levels at different color temperatures for the tunable light module of FIG. 1A after the tunable light module experiences degradation, in accordance with various embodiments. As described above, over time, the color lamps inside the tunable light module can degrade. For example, this can be due to plastic browning, silicone degradation, optical coupling degradation, phosphorus popping in phosphorus-based LEDs, or any combination thereof. After at least some of the color channels degrade, the maximum brightness levels at the color temperatures may decrease as illustrated. Furthermore, other performance metrics (e.g., CRI, efficiency, or efficacy) may have fallen with the degradation as well.

Figure 1C:
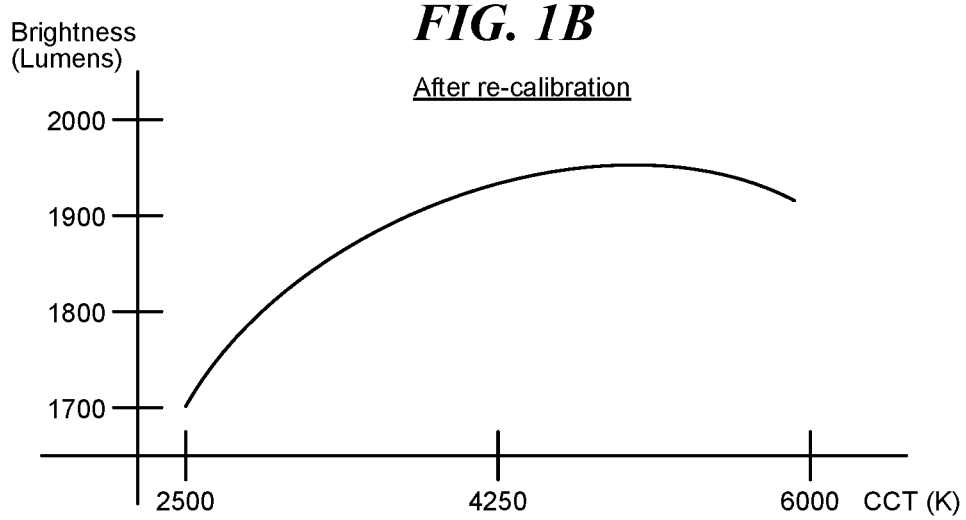
FIG. 1C is a graph illustrating an example of maximum brightness levels at different color temperatures for the tunable light module of FIG. 1C after the tunable light module is recalibrated after degradation, in accordance with various embodiments.

FIG. 1C is a graph 106 illustrating an example of maximum brightness levels at different color temperatures for the tunable light module of FIG. 1B after the tunable light module is recalibrated after degradation, in accordance with various embodiments. The graph 106 illustrates the benefit of recalibration. After recalibration, the tunable light module can generate illumination at the same range of color temperatures as at the pre-deployment stage. Furthermore, the tunable light module can improve at least one of the performance metrics by modifying/adjusting the color mixing plan. In the illustrated case, the tunable light module is able to improve the maximum brightness at several color temperatures as compared to the levels after degradation and prior to recalibration as shown in FIG. 1B.

Figure 2A:
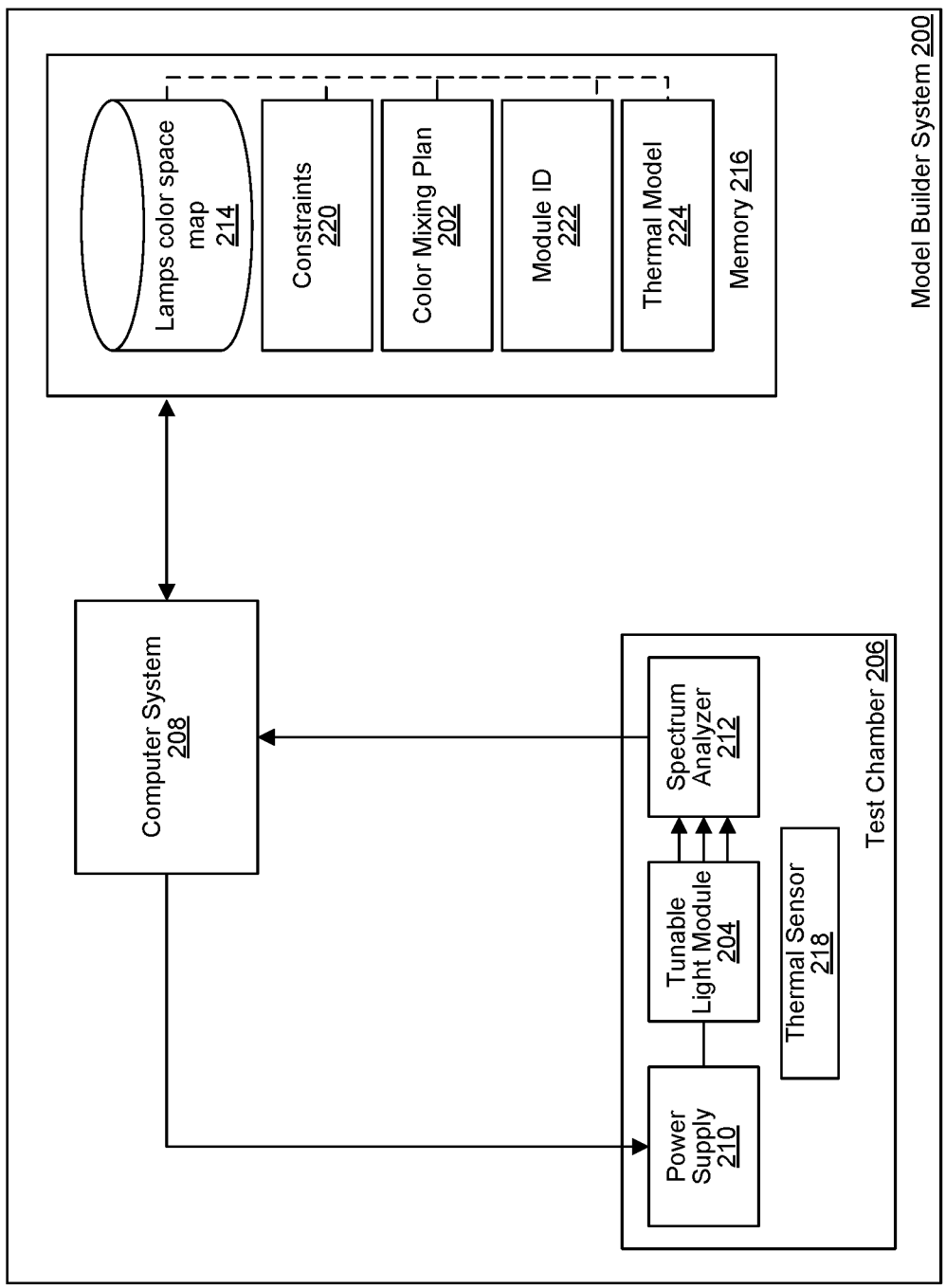
FIG. 2A is a block diagram of a model builder system for generating a color mixing plan at a pre-deployment stage of a tunable light module, in accordance with various embodiments.

FIG. 2A is a block diagram of a model builder system 200 for generating a color mixing plan 202 at a pre-deployment stage of a tunable light module 204, in accordance with various embodiments. The tunable light module 204 or the LEDs of the tunable light module 204 can be placed inside a test chamber 206, free from any thermal, electrical, and/or optical pollution and interference. The test chamber 206 can be hermetically sealed.

The model builder system 200 can include a computer system 208. The computer system 208 contains logic for the building of the color mixing plan 202. The computer system can be coupled to a power supply 210 for the tunable light module 204. The power supply 210 can be the power supply that will be used by the tunable light module 204 after deployment or an external power supply. The computer system 208 can iterate through different driving conditions for one or more LEDs for the tunable light module 204 using the power supply 210. In some embodiments, while testing, the one or more LEDs are yet to be installed in the tunable light module 204. In response to the driving currents from the power supply 210, the one or more LEDs produce illumination that is captured and analyzed by a spectrum analyzer 212. For each iteration, the resulting spectral characteristics associated with the driving condition is saved in a lamps color space map 214 on a memory 216.

In some embodiments, the test chamber 206 can include a thermal sensor 218. In some embodiments, the temperature measured at the thermal sensor 218 is also stored in the lamps color space map 214. In other embodiments, the temperature measured at the thermal sensor 218 associated with the driving condition is saved to a separate temperature map.

After the computer system 208 maps through a range of possible driving conditions for each color channel or each LED of the tunable light module 204, the computer system 208 can finalize the lamps color space map 214. The computer system 208 can receive performance metric constraints 220 (e.g. from an agent of the manufacturer). The computer system 208 can compute the color mixing plan 202 based on the lamps color space map 214 and the constraints 220. The computer system 208 can select optimal coefficients, flux values, and/or or driving condition values corresponding to each color characteristic, such as the CCT, that satisfy the constraints 220, such as brightness, CRI, efficiency, or efficacy. The computer system 208 can associate the computed color mixing plan 202, the constraints 220 and the lamps color space map 214 with a module identifier 222 of the tunable light module 204. In some embodiments, the computer system 208 then saves the color mixing plan 202 onto a memory of the tunable light module 204 and uploads the constraints 220 and the lamps color space map 214 to a cloud data storage for future reference.

In some embodiments, the computer system 208 can also compute a thermal model 224 that corresponds to the tunable light module 204. The thermal model 224 can be generated based on the temperature map. The thermal model 224 can determine the transient junction temperature produced by driving the LEDs of the tunable light module 204. The thermal model 224 can also be saved onto a memory of the tunable light module 204 such that the tunable light module 204 can determine its junction temperature in real-time after deployment. In some embodiments, the tunable light module 204 can accurately produce illumination to a specific spectral characteristic based on the color mixing plan 202 and the junction temperature determined from the thermal model 224.

Figure 2B:
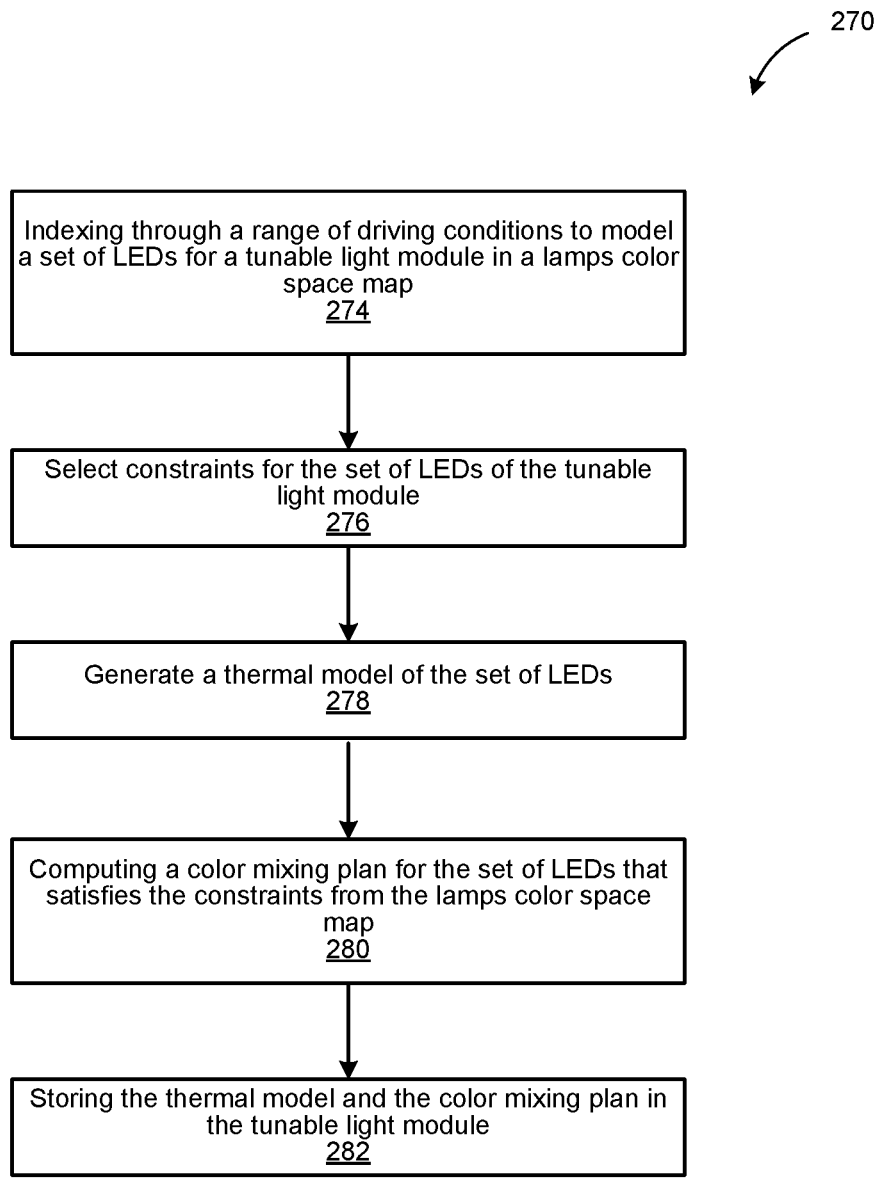
FIG. 2B is a flow chart illustrating a method of generating a color mixing plan at a pre-deployment stage of a tunable light module, in accordance with various embodiments.

FIG. 2B is a flow chart illustrating a method 270 of generating a color mixing plan, such as the color mixing plan 202, at a pre-deployment stage of a tunable light module (e.g., the tunable light module 204), in accordance with various embodiments. The color mixing plan can enable the tunable light module to produce adjustable CCTs so that it may be adjusted between, for example, different "white"/CCT levels. Further, during such adjustment the color tunable module can maintain, maximize, or optimize its CRI according to the color mixing plan.

At step 274, the model builder system 200 can index through a range of driving conditions to model a set of LEDs for the tunable light module in the lamps color space map 214. This discussion will involve the modeling of LEDs, but in other embodiments, the tunable light module can include light sources/lamps other than LEDs. Modeling LEDs can also include gathering manufacturer data sheets that specify LED performance data under specific conditions, and developing functional approximations of LED performance by, for example, fitting to the performance data using a least mean squares method. In this way, gaps in published LED performance data can be filled. Further, new relationships between LED performance variables can be developed. For example, a function for the current required to generate a desired luminous flux from an LED operating at a given temperature can be developed by iterating through the range of driving conditions and monitoring the output illumination.

At step 276, constraints for the LEDs of the tunable light module are selected. Constraints can include, for example, constraints on the electrical or physical properties of the tunable light module, such as the total luminous flux, the total luminous efficacy, the total luminous efficiency, and the maximum operating temperature. Further, constraints can include constraints on the color properties of the tunable light module, such as constraints on the CCT, the CRI, the color difference (e.g., as defined in CIEDE 2000), the delta-UV (e.g., as defined in CIE 1961), or the xy color coordinate.

At step 278, the model builder system 200 can generate a thermal model for the LEDs. At step 280, the model builder system 200 can compute a color mixing plan for the set of LEDs of the tunable light module. The color mixing plan can specify the luminous flux required from all LEDs in a lighting node to achieve a desired CCT, while maintaining or optimizing a desirable CRI. The model builder system 200 can deploy a brute force algorithm to solve for the optimal flux. For example, the model builder system 200 can select a total luminous flux of 1000 lumens, and then by stepping through possible combinations of luminous flux for each LED in the tunable light module while maintaining the total luminous flux. Thus, for example, a first LED may be set to output 990 lumens, a second LED may be set to output 5 lumens, and a third LED may be set to output 5 lumens, while the CCT and the CRI of the tunable light module can be measured and/or computed. Continuing the brute force algorithm, the first LED may be set to output 985 lumens, the second LED may be set to output 10 lumens, and the third LED may be set to output 5 lumens, and the CCT and the CRI of the tunable light module can be measured and/or computed again.

Notably, in this example a step size of 5 lumens has been used, but in other embodiments a different step size can be selected. Larger step sizes can be used when results vary slowly. The brute force algorithm may be made further manageable by avoiding combinations that drive the total light output away from the Planck locus. As is known in the art, the Planck locus (i.e. the Plankian locus) is a line or region in a chromaticity diagram away from which a CCT measurement ceases to be meaningful. Thus, for example, a combination which has too much red output, thereby driving the output of the entire lighting node away from the Plank locus, can be avoided.

Step 280 may include computing a performance evaluation for LEDs of the tunable light module. For example, the CRI, luminous efficacy, luminous efficiency, color difference, delta-UV, or other parameters can be evaluated against the CCT. For example, FIG. 2D is a graph illustrating corresponding luminous efficacy of color points in the color mixing plan of FIG. 2B. The luminous efficacy is illustrated as a dashed line 252. The dashed line 252 corresponds to a particular set of color points generated by mixing the luminous outputs of white, red, amber, and green LEDs.

At step 282, the thermal model and the color mixing plan is stored in a memory of the tunable light module. The color mixing plan may be stored as, for example, a look-up table of points on the curves of luminous flux versus CCT, or as, for example, a functional approximation set of coefficients. The luminous flux can be directly correlated with the driving conditions (e.g., driving current) of a LED. Notably, in one embodiment the storage of a look-up table is memory intensive, and in another embodiment the storage of coefficients is processor- or logic-intensive. In the latter case, a processor or other control circuitry can be utilized to calculate polynomial results based on stored coefficients.

Figure 2C:
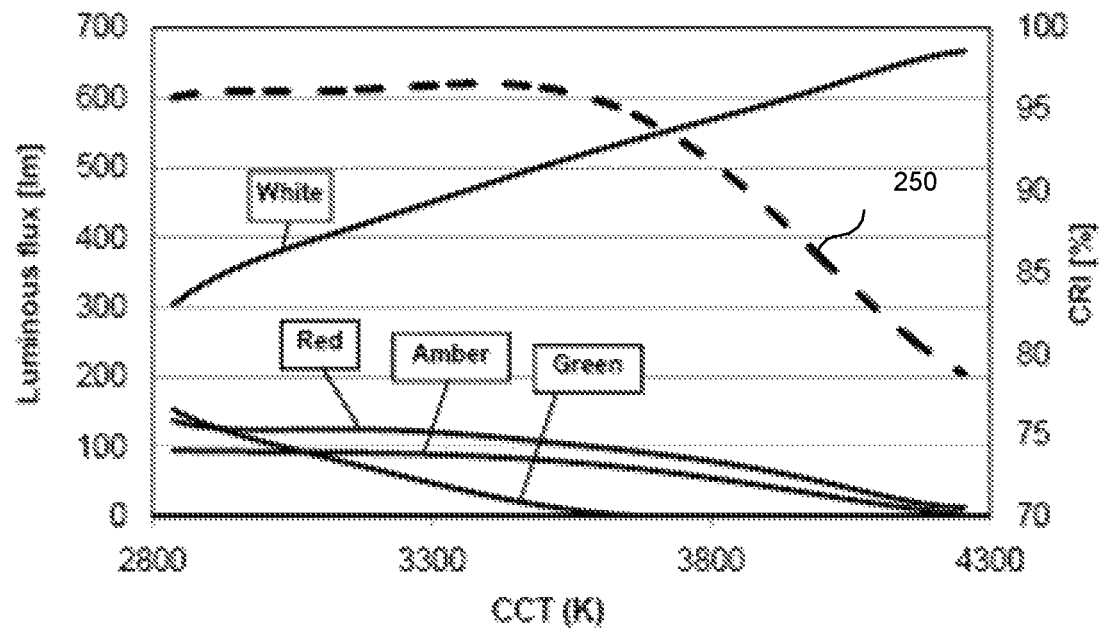
FIG. 2C is a graph illustrating an example of a color mixing plan including an optimized CRI.
Figure 2D:
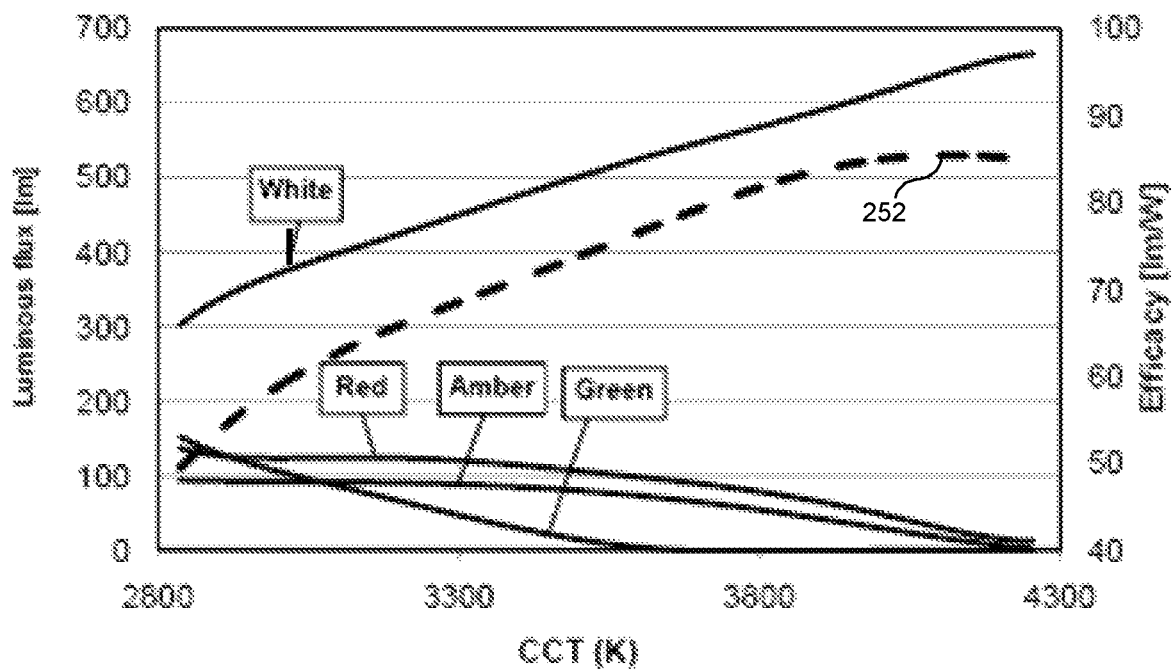
FIG. 2D is a graph illustrating corresponding luminous efficacy of color points in the color mixing plan of FIG. 2B.

FIG. 2C is a graph illustrating an example portion of a color mixing plan, such as the color mixing plan 202, including an optimized CRI. The color mixing plan depicts the luminous flux (in lumens) of a white LED, a red LED, an amber LED, and a green LED for various increasing CCTs (in Kelvins). The increasing output of the white LED, and the decreasing outputs of the red, amber, and green LEDs, with increasing CCT have been generated by the brute force algorithm to maximize the CRI, depicted in dashed line 250. Notably, at a given CCT, other valid combinations of white, red, amber, and green output exist, but the combination depicted in color mixing plan actually achieves the optimum CRI at the dashed line 250.

Values in color mixing plan can be calculated in several ways. For example, the CCT in color mixing plan can be calculated by additive color mixing with CIE chromaticity coordinates, wherein the CCT is the weighted average of the CIE chromaticity coordinates of each LED using luminous flux as the weighting factor. Alternatively, the CCT can be calculated by spectral color mixing using spectral power distributions of LEDs, wherein the combined spectral power distribution, from which the CCT can be computed, is the weighted average of the spectral power distributions of each LED using luminous flux as the weighting factor.

Figure 3:
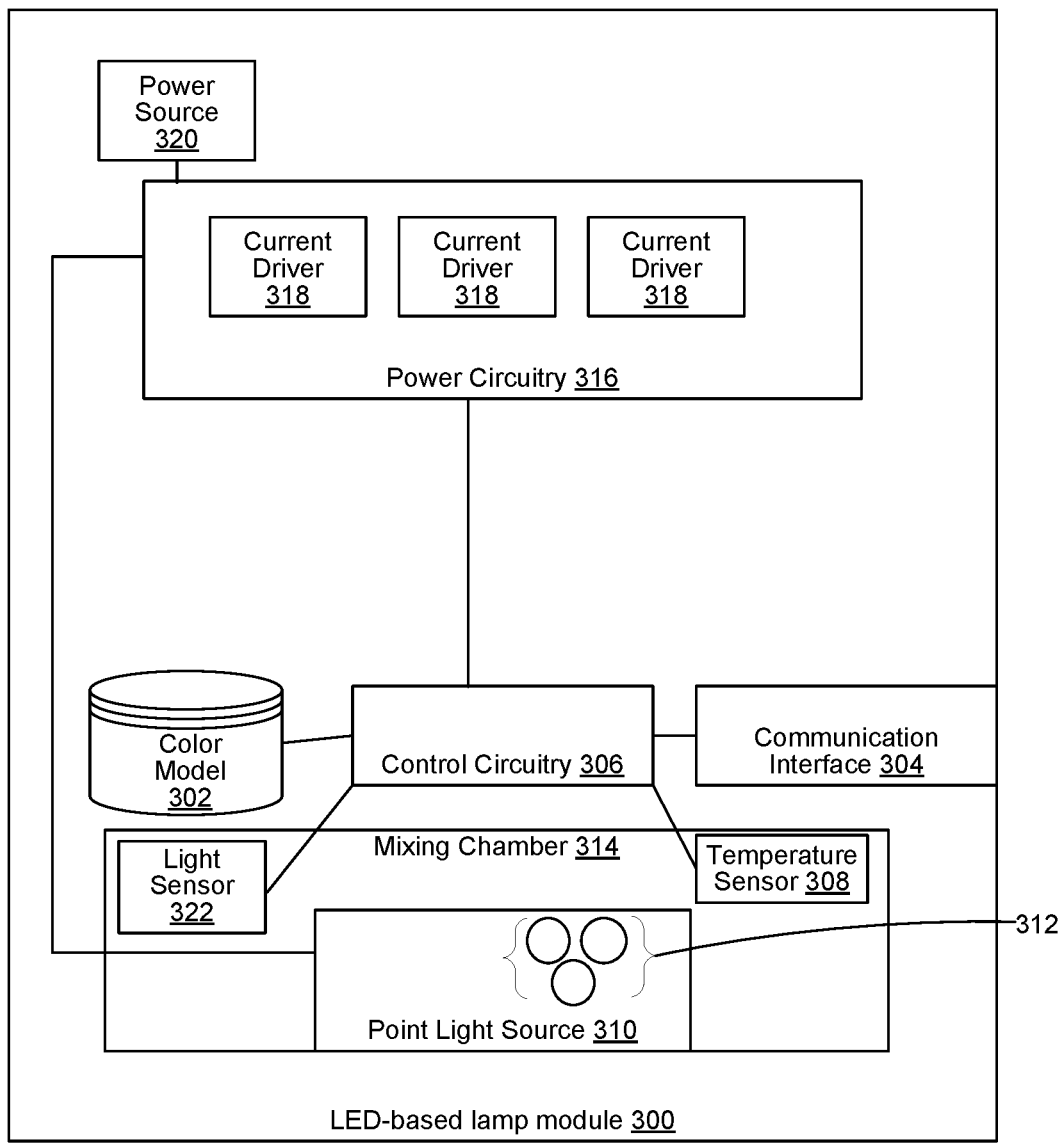
FIG. 3 is a block diagram of a LED-based tunable light module, in accordance with various embodiments.

FIG. 3 is a block diagram of a LED-based lamp module 300 (e.g., the tunable light module 204 of FIG. 2A), in accordance with various embodiments. The LED-based lamp module 300 includes a color model store 302, a communication interface 304, a control circuitry 306, a temperature sensor 308, a point light source 310 comprising different color LEDs 312, a mixing chamber 314, power circuitry 316 including current drivers 318 for the color LEDs 312, a power source 320, a light sensor 322, or any combination thereof. The color model store 302 is a memory device or a portion of a memory device for storing a color mixing plan as defined above.

The communication interface 304 can include a hardware port for a wired connection or a radio antenna for establishing wireless communication. In some embodiments, the communication interface 304 can include multiple radio antennas, such as one for transmitting and one for receiving. The communication interface 304 can execute communication protocol instructions for formatting a signal (e.g. a digital or an analog signal) to transmit through the hardware port or the radio antenna. Likewise, the communication interface 304 can execute the communication protocol instructions to interpret a signal (e.g., a digital or analog signal) received through the hardware port or the radio antenna. The communication protocol instructions, for example, can be implemented by a processor configured with software executable instructions. These executable instructions can be stored in a memory device, such as the same memory device as the color model store 302 or another memory device. For another example, the instructions can be implemented by application-specific integrated circuit, a programmable controller, field programmable gate array (FPGA), other digital or analog circuitry, or any combination thereof.

The control circuitry 306 executes control instructions to operate the LED-based lamp module 300. The control circuitry 306 can execute light tuning commands received through the communication interface 304. For example, the control circuitry 306 can determine adjustment commands to the power circuitry 316 including the current drivers 318. The control circuitry 306 can also detect context of information within the LED-based lamp module 300. For example, the control circuitry 306 can determine the context via measurements taken from the temperature sensor 308, the light sensor 322, power measurement circuit (e.g., for voltage or current) in the power circuitry 316, or any combination thereof. The control circuitry 306 can generate and implement a schedule to report context information and sensor measurements to the controller via the communication interface 304.

The control circuitry 306 can execute various other user-initiated, conditional (i.e., a background/passive command triggered when a contextual condition is detected), or scheduled commands (i.e., a background/passive command executed sua sponte by the control circuitry 306 in accordance with a schedule). Such commands can include a calibration command, a light maintenance or testing command, a light effect sequence command (i.e., executing a series of light/color tuning commands in accordance with a preset sequence or schedule), an optical/visual communication command (e.g., executing a light effect sequence and/or monitoring for a nearby light effect sequence for the purpose of communication), or any combination thereof. The optical/visual communication command can be configured for optical/visual communication between lamp modules (e.g., digital communication), or between the LED-based lamp module 300 and a nearby person (e.g., human understandable communication).

The control circuitry 306 can communicate with a light control application, in real time or asynchronously, running on a controller connected through the communication interface 304. In some embodiments, the control circuitry 306 can communicate with a light control service, in real time or asynchronously, provided by a computer server. The control circuitry 306 and the light control service can relay its back and forth communications through the controller.

In some embodiments, the communication interface 304 can receive commands to reconfigure the communication protocol portion of the communication interface 304 (e.g., via reconfiguring the instructions for execution by the communication interface 304). In some embodiments, the communication interface 304 can receive commands to reconfigure or update the control logics of the control circuitry 306 (e.g., via reconfiguring the instructions for execution by the communication interface 304).

The control circuitry 306 can use the temperature sensor 308 to measure or approximate an operating temperature of the point light source 310. In order to provide accurate and consistent color characteristics, the control circuitry 306 uses the color mixing plan in the color model store 302 to determine the proper operating conditions (e.g., driving currents to the color LEDs 312) to achieve the target light characteristics. The color mixing plan, for example, can map operating temperature and light characteristics to driving currents. Hence, the control circuitry 306 can use the temperature sensor 308 to determine the operating temperature at the point light source 310. In some embodiments, because the color LEDs 312 in the point light source 310 are so small and closely packed that it is difficult to place the temperature sensor 308 at the point light source 310, the temperature sensor 308 is placed at a different location to approximate the operating temperature. For example, the temperature sensor 308 can be located at a heat sink of the point light source 310 or a temperature pad. In some embodiments, prior to deployment of the LED-based lamp module 300, a model builder computer system (i.e., a computer system configured to model behaviors of the LED-based lamp module 300) that builds the color mixing plan can also build a temperature variation model. The temperature variation model can map an observed temperature at the temperature sensor 308 to the actual operating temperature of the color LEDs 312. In some embodiments, the temperature variation model can also approximate the operating temperature based on driving currents and/or running time of the color LEDs 312.

When executing a command to adjust a light characteristic of one of the color LEDs 312, the control circuitry 306 can implement a jitter avoidance mechanism when adjusting the driving current of the color LED. A visual "jitter" is an observable unsteady variance or noise when a person is observing the LED-based lamp module 300 executing an adjustment of the light characteristic in discrete steps. The jitter avoidance mechanism computes discrete steps in adjusting the driving current such that the person is unable to observe the visual jitter. For example, this can be achieved by having finer discrete steps or creating discrete steps in a pattern to emulate continuous adjustment.

The point light source 310 can comprise the different color LEDs 312. The color LEDs 312 enables the point light source 310 to produce a wide range of color temperature, brightness, hue, and saturation. For example, mixing the light produced by the color LEDs 312 can produce near-white light that emulates a blackbody radiator, such as the sun. The point light source 310 is advantageous because it enables sensors to provide instant feedback from a single location for all the color LEDs 312. For example, this is useful to use the light sensor 322 for a re-calibration process. The light sensor 322 can be a PIN diode, a tri-stimulus sensor (e.g., a colorimeter), or a spectrum analyzer.

The mixing chamber 314 is an optical component around the point light source 310 to manipulate the light produced from the point light source 310. The mixing chamber 314 can collect the light. For example, the mixing chamber 314 can have a portion to collect the light using a shell with a reflective inner surface. The inner reflective surface can be a reflective coating. Alternatively, the shell can be of a material with a high refractive index that causes total internal reflection at the majority of incident angles from the light collection portion of the shell or the color LEDs 312.

The shell can have at least a close end adjacent to and under the point light source 310 (e.g., where the point light source 310 sits on a circuit board, the close end can be under the circuit board). In some embodiments, the close end can have a reflective surface as well. The mixing chamber 314 can be narrowest around the close end and expands in size away from the point light source 310. For example, the shell can be a parabolic shape to collect the light. The parabolic shell can surround the point light source 310 to collect the omnidirectional light and pipe it at a direction away from the close end.

The mixing chamber 314 can have a portion to mix the light, including patterns on the shell to promote light rays from the different color LEDs 312 to mix with each other. The portion to mix light can mix the light without changing the directionality of the light rays that are moving away from the point light source 310 (e.g., mixing the light on a plane perpendicular to the direction of the light rays from the point light source 310). The mixing chamber 314 can have a portion to collimate or redirect the light outside of the shell. The mixing chamber 314 can have an exit aperture in the shell to output the light from the shell. In some embodiments, the mixing chamber 314 can be supplemented with a modular cover. The modular cover can be used to further manipulate the light, including acting as a diffuser, light direction changer, or filter.

The power circuitry 316 includes the current drivers 318 for the color LEDs 312. The power circuitry 316 draws power from the power source 320, which can be a battery or a DC power supply that converts AC power to DC. The current drivers 318 are coupled to the control circuitry 306. Each of the current drivers 318 can control at least one of the color LEDs 312. The control circuitry 306 can command each of the current drivers 318 to drive its respective LED at a particular current level.

Portions of components (e.g., circuitry, storage, sensors, etc.) associated with the LED-based lamp module 300 may each be implemented in the form of special-purpose circuitry, in the form of one or more appropriately programmed programmable processors, a single board chip, a field programmable gate array, a network capable computing device, a virtual machine, a cloud-based terminal, or any combination thereof. For example, the components described can be implemented as instructions on a tangible storage memory capable of being executed by a processor or other integrated circuit chip. The tangible storage memory may be volatile or non-volatile memory. In some embodiments, the volatile memory may be considered "non-transitory" in the sense that it is not transitory signal. Memory space and storages described in the figures can be implemented with the tangible storage memory as well, including volatile or non-volatile memory.

Each of the components may operate individually and independently of other components. Some or all of the components may be executed on the same host device or on separate devices. The separate devices can be coupled together through one or more communication channels (e.g., wireless or wired channel) to coordinate their operations. Some or all of the components may be combined as one component. A single component may be divided into sub-components, each sub-component performing separate method step or method steps of the single component.

In some embodiments, at least some of the components share access to a memory space. For example, one component may access data accessed by or transformed by another component. The components may be considered "coupled" to one another if they share a physical connection or a virtual connection, directly or indirectly, allowing data accessed or modified from one component to be accessed in another component. In some embodiments, at least some of the components can be upgraded or modified remotely (e.g., by reconfiguring executable instructions that implements a portion of the components). The LED-based lamp module 300 may include additional, fewer, or different components for various applications.

Figure 4:
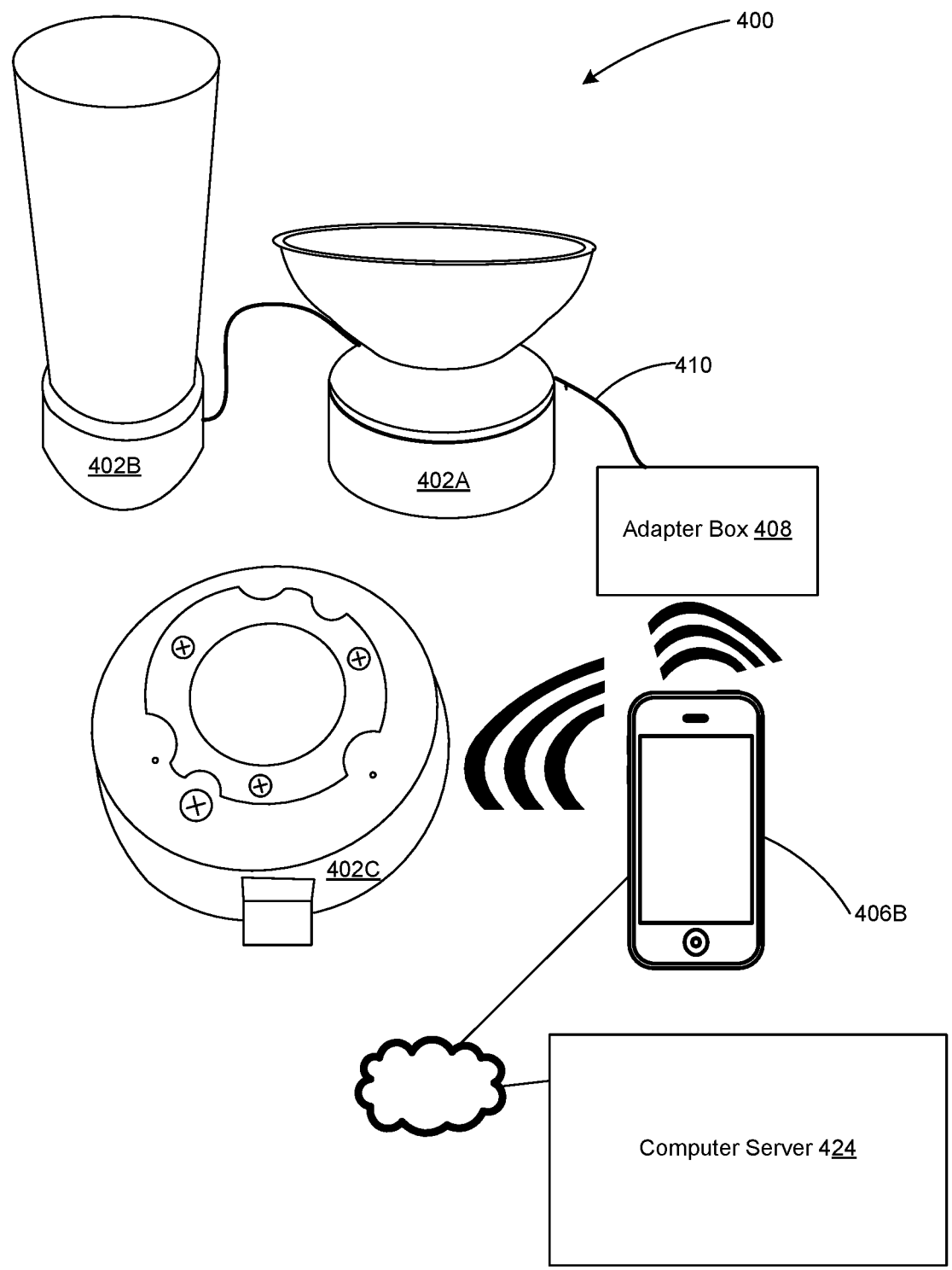
FIG. 4 is an illustration of a configurable lamp system to operate a tunable light module, in accordance with various embodiments.

FIG. 4 is an illustration of a configurable lamp system 400 to operate a tunable light module, in accordance with various embodiments. The configurable lamp system 400 includes one or more LED-based lamp modules (e.g., a lamp module 402A, a lamp module 402B, and a lamp module 402C, collectively as the "lamp modules 402"). The lamp modules 402 may produce directional light, linear light (e.g., light along a curved or straight line), collimated light, spot light, multidirectional light, omnidirectional light (e.g., point light source), or other geometries. In some embodiments, the lamp modules 402 can be configured with different modular covers (e.g., a light collector cover 404A or a diffuser cover 404B, collectively as the "lamp module covers 404"). The lamp modules 402 can be independently replaceable. The configurable lamp system 400 is able to produce a target light characteristic (e.g., CCT, hue, saturation, brightness, or any combination thereof) in response to receiving a light tuning command utilizing a color mixing plan. The lamp modules 402 can each include an LED set. The LED set can include LEDs of at least two colors.

The lamp modules 402 may be configured with one or more mechanisms for communicating with an external control device. For example, the lamp modules 402 can communicate with a wired controller 406A via an adapter box 408. The wired controller 406A, for example, can be a DMX control box. The adapter box 408 is configured to convert communication signal between different communication protocols (e.g., DMX, Lutron, Zigbee Light Link, digital addressable lighting interface (DALI), Bluetooth, Bluetooth LE, etc.). The adapter box 408 can be configured for wired communication, wireless communication, or both. For example, the adapter box 408 may connect with at least a subset of the lamp modules 402 via a wired connection and communicate with the wired controller 406A via a different wired connection. In another example, the adapter box 408 may connect with at least a subset of the lamp modules 402 via a wireless protocol (e.g., Bluetooth LE) and communicate with the wired controller 406A via a wired connection or a wireless controller 406B via a wireless connection (e.g., Bluetooth, Wi-Fi or Wi-Fi direct).

In some embodiments, one or more of the lamp modules 402 can also communicate directly with a wireless controller 406B via a wireless protocol. These lamp modules can include an internal wireless module to communicate directly with the wireless controller 406B. Alternatively, these lamp modules can communicate wirelessly through the adapter box 408. The adapter box 408 can be configured for digital to digital communication (i.e., digital to/from the lamp modules 402 and digital to/from the wireless controller 406B), digital to analog communication (i.e., digital to/from the lamp modules 402 and analog to/from the wireless controller 406B), analog-to-digital communication (i.e., analog to/from the lamp modules 402 and digital to/from the wireless controller 406B), or analog to analog communication (i.e., analog to/from the lamp modules 402 and analog to/from the wireless controller 406B). In a preferred embodiment, the adapter box 408 is configured to communicate digitally to the lamp modules 402 to provide precise numeric values of light characteristics. In some embodiments, the adapter box 408 is configured to communicate with a 0 to 10V dimmer acting as the wired controller 406A, and hence, takes in an analog signal that is then converted to a digital command to the lamp modules 402.

Further, the adapter box 408 can include one or more channels of communication to each of the lamp modules 402. At least one of the channels can provide color temperature control. At least one of the channels can provide brightness control. At least one of the channels can provide hue control. At least one of the channels can provide saturation control.

The adapter box 408 may be connected to the lamp modules 402 via the interconnect 410. In some embodiments, the adapter box 408 can be connected to multiple interconnects to relay commands to and data from multiple groups of lamp modules. The interconnect 410 can serially linked together one or more of the lamp modules 402 such that a single connection of the interconnect 410 to the adapter box 408 enables the wired controller 406A or the wireless controller 406B to control every one of the lamp modules 402 connected to the interconnect 410. The interconnect 410, for example, can be a RS485 bus.

In some embodiments, the adapter box 408 can draw power from a wired connection to the wired controller 406A, from a wired connection (e.g., the interconnect 410) to one of the lamp modules 402, or both. In some embodiments, the adapter box 408 can have its own power source. In some embodiments, the adapter box 408 can draw power from a wired connection to supplement power drawn from an internal power source or vice versa.

In some embodiments, the wired controller 406A or the wireless controller 406B can be connected to a core network (e.g., the Internet), such as through a network equipment (e.g., a wireless WiFi router) or a cellular Internet provider (e.g., LTE, 3G, etc.). A computer server 424 in the core network can implement a light control service that is accessible by the wired controller 406A or the wireless controller 406B. The wired controller 406A or the wireless controller 406B, for example, can implement a user interface for controlling the lamp modules 402. One or more of the functionalities of the wired controller 406A or the wireless controller 406B can be assisted by the light control service, including re-calibration, maintenance, storage of color mixing plans, storage of light adjustment history, storage of lamp module groups, storage of user preference of light settings, storage of conditional rules associated with light settings (e.g., automatically sending light tuning commands based on an observable context at one or more of the lamp modules 402), etc.

Figure 5:
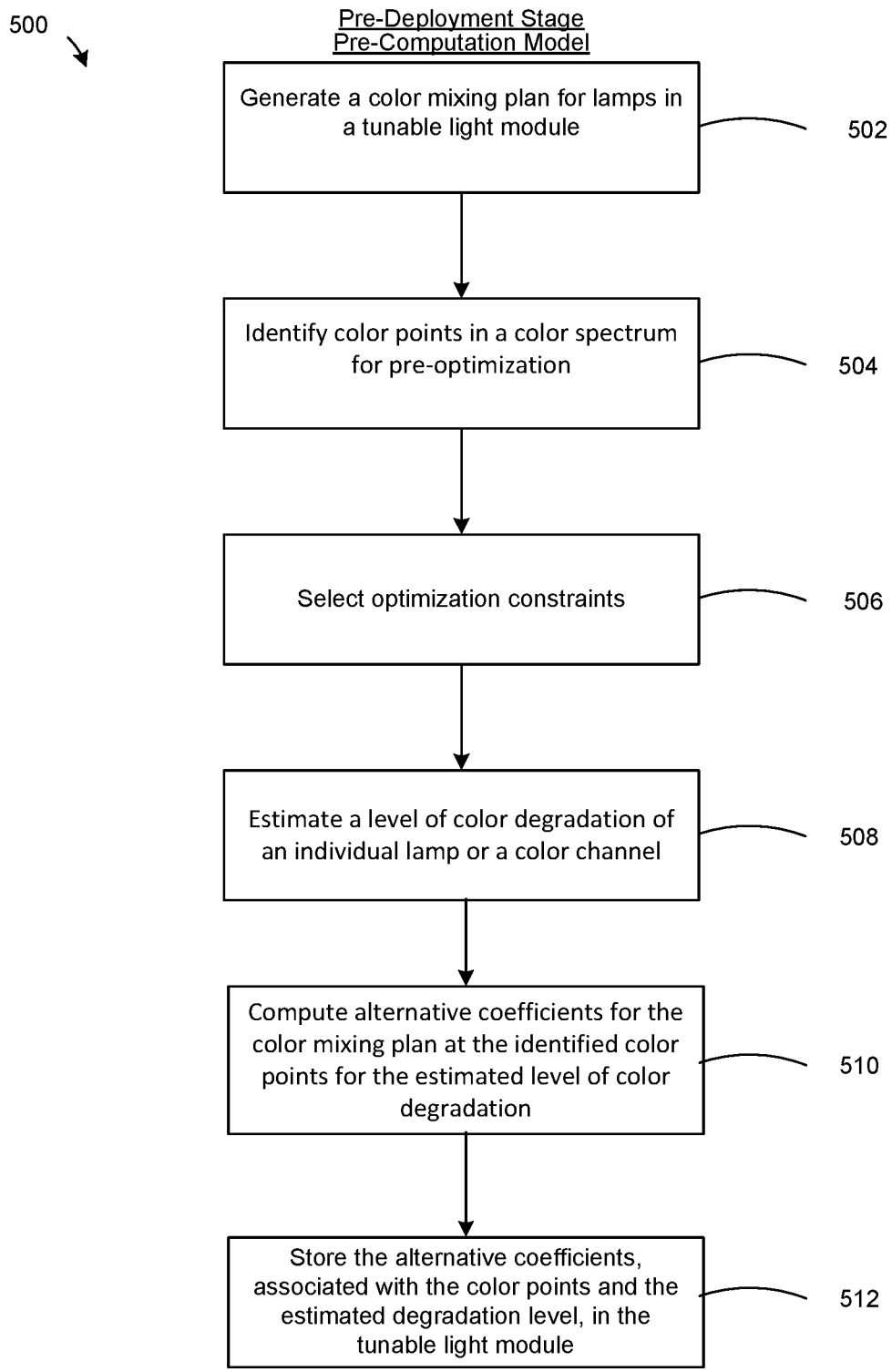
FIG. 5 is a flow chart of a method of pre-computing adjustments to a color mixing plan of a tunable light module at the pre-deployment stage to support recalibration after deployment, in accordance with various embodiments.

FIG. 5 is a flow chart of a method 500 of pre-computing adjustments to a color mixing plan of a tunable light module (e.g., the LED-based lamp module 300 of FIG. 3) at the pre-deployment stage to support recalibration after deployment, in accordance with various embodiments. At step 502, a model builder system, such as the model builder system 200 of FIG. 2A, can generate a color mixing plan for the tunable light module. For example, step 502 can be the method 270 of FIG. 2B.

At step 504, the model builder system can identify color points in a color spectrum for pre-optimization against potential degradation. At step 506, the model builder system can select optimization constraints (e.g., including trade off amongst initial lumen, CRI threshold, efficiency threshold, efficacy threshold, or any combination thereof) for light produced from the tunable light module. At step 508, the model builder system can estimate a level of color degradation of an individual lamp (e.g., LED) or a color channel (e.g., lamps of the same color).

At step 510, the model builder system can compute alternative coefficients for the color mixing plan at the identified color points for the estimated level of color degradation based on the selected optimization constraints. At step 512, the model builder system can store the alternative coefficients, associated with the color points and the estimated degradation level, together with or in the color mixing plan in the tunable light module.

Figure 6:
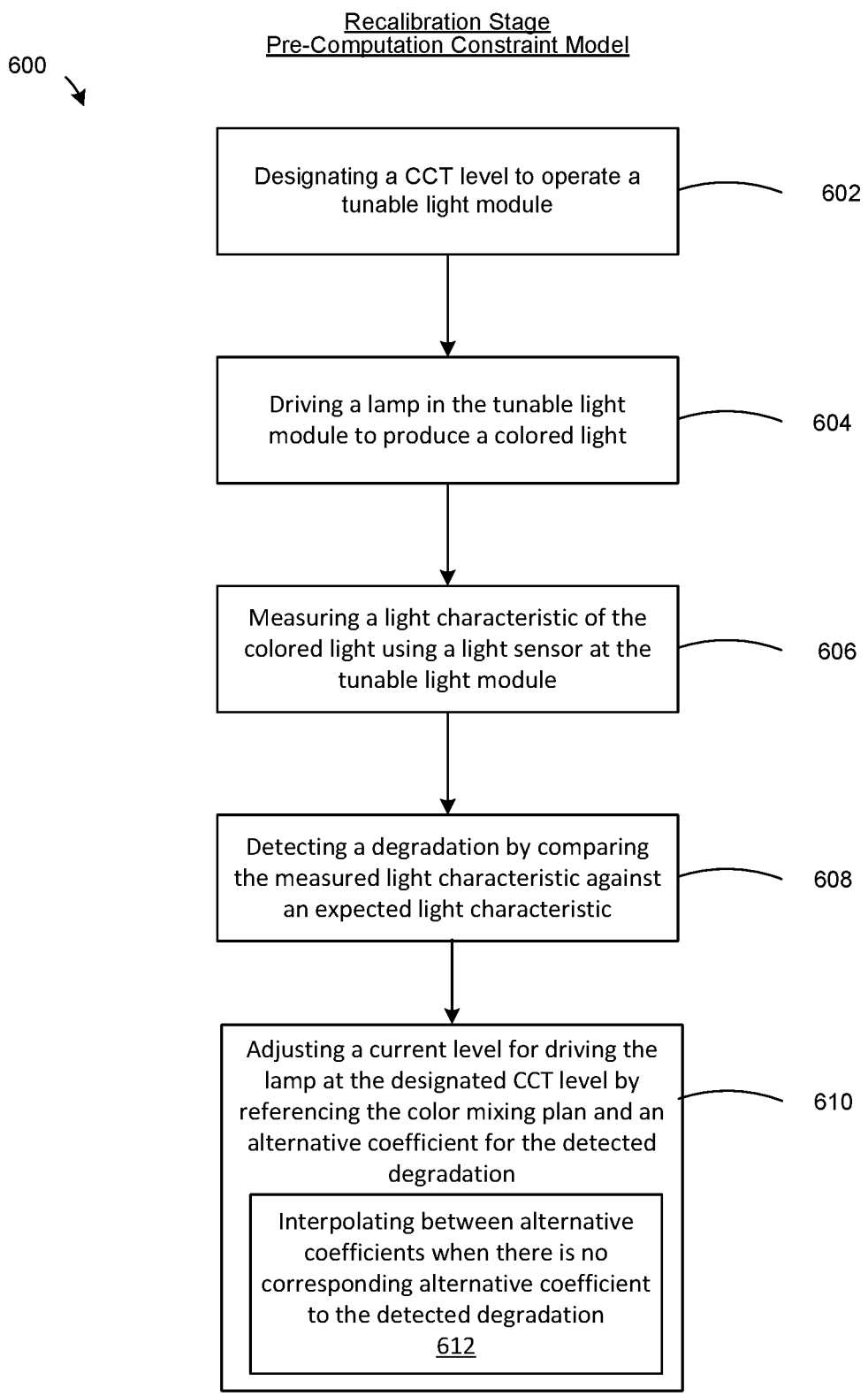
FIG. 6 is a flow chart of a method of recalibrating a color mixing plan of a tunable light module after deployment, in accordance with various embodiments.

FIG. 6 is a flow chart of a method 600 of recalibrating a color mixing plan of a tunable light module (e.g., the LED-based lamp module 300 of FIG. 3) after deployment, in accordance with various embodiments. At step 602, a control circuitry (e.g., the control circuitry 306 of FIG. 3) of the tunable light module can designate a CCT level to operate. At step 604, the control circuitry can drive a lamp (e.g., an LED) in the tunable light module to produce a colored light. The control circuitry can drive the lamp according to a color mixing plan, such as the color mixing plan produced at step 502 of FIG. 5, to achieve the designated CCT level. In some embodiments, in order to measure a light characteristic of the lamp, a single lamp is driven according to the color mixing plan for the CCT level, even when the color mixing plan for the CCT level may indicate that, to achieve the CCT level, multiple lamps have to be used.

At step 606, the control circuitry can measure a light characteristic of the colored light using a light sensor in the tunable light module. For example, the control circuitry can measure the brightness of the lamp. At step 608, the control circuitry can detect a degradation by comparing the measured light characteristic against an expected light characteristic. A memory of the tunable light module may store the expected light characteristic. For example, the memory can store the expected brightness of the lamp at the designated CCT level.

At step 610, the control circuitry can adjust a current level for driving the lamp at the designated CCT level by referencing the color mixing plan and an alternative coefficient for the detected degradation. The memory of the tunable light module may store both the color mixing plan and the alternative coefficient. For example, the alternative coefficient can be the alternative coefficient computed at step 510 of FIG. 5.

Where there is no corresponding alternative coefficient for the detected degradation, the control circuitry can interpolate between alternative coefficients at step 612. For example, the control circuitry can determine the closest degradation levels represented by alternative coefficients are stored in or associated with the color mixing plan. The control circuitry can then compute a substitute coefficient by interpolating (e.g., linearly interpolate) between the alternative coefficients corresponding to these closest degradation levels.

Figure 7:
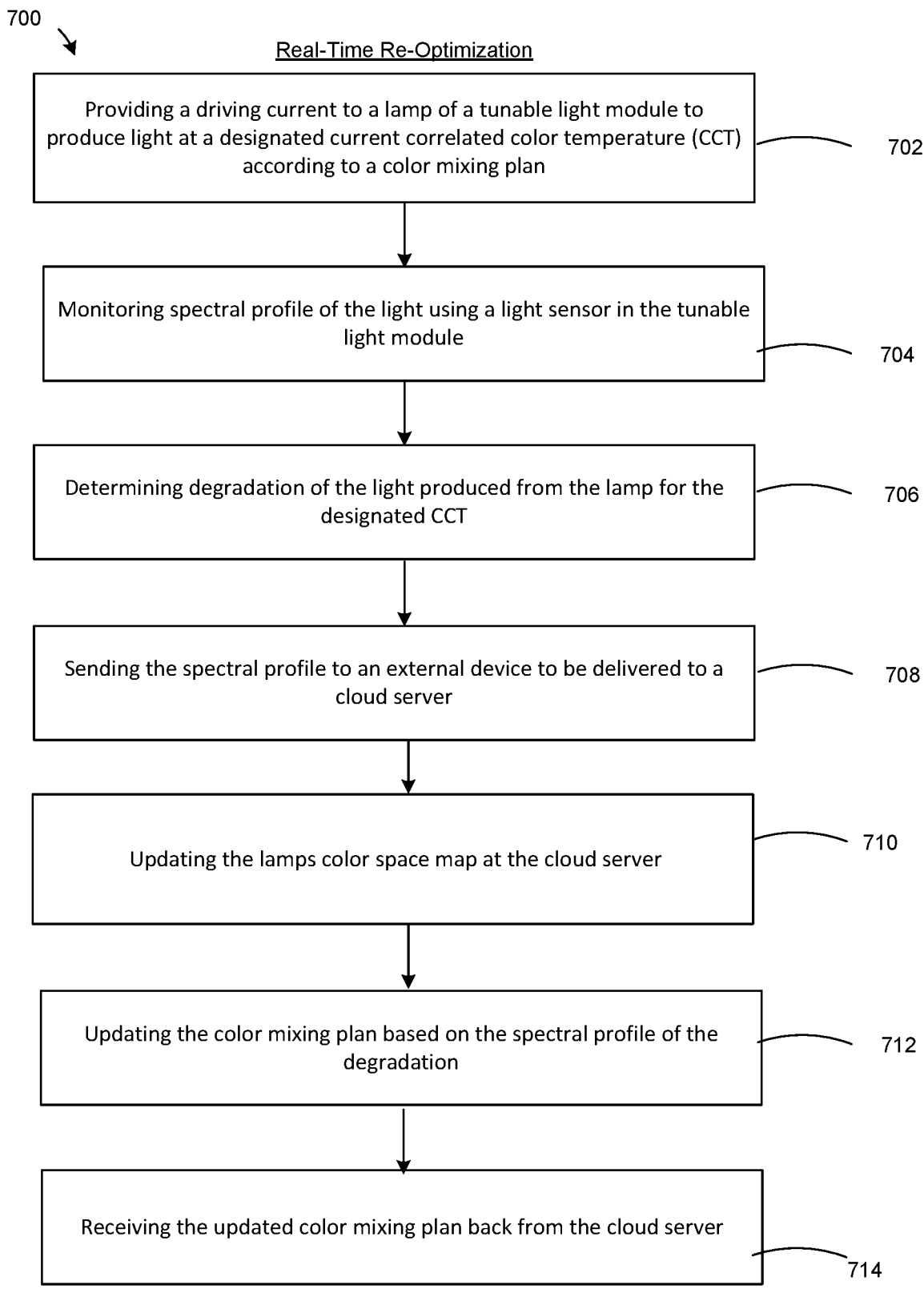
FIG. 7 is a flow chart of a method of real-time re-optimization of a color mixing plan of a tunable light module after deployment, in accordance with various embodiments.

FIG. 7 is a flow chart of a method 700 of real-time re-optimization of a color mixing plan of a tunable light module (e.g., the LED-based lamp module 300 of FIG. 3) after deployment, in accordance with various embodiments. At step 702, a control circuitry (e.g., the control circuitry 306 of FIG. 3) of the tunable light module can provide a driving current to a lamp of the tunable light module to produce light at a designated CCT according to a color mixing plan.

At step 704, the control circuitry can monitor spectral profile of the light produced from the lamp using a light sensor in the tunable light module. For example, the light sensor can be a tristimulus sensor or a spectral analyzer. The tristimulus sensor measures filtered light using at least three sensors adapted to have the same sensitivity as human eyes and thus directly measures the tristimulus values X, Y, and Z. The spectral analyzer can include multiple sensors that measure the spectral profile of the light at respective wavelengths or respective narrow wavelength ranges.

At step 706, the control circuitry can determine a degradation of the light produced from the lamp for the designated CCT. For example, the control circuitry can compare the spectral profile measured at step 704 with an expected spectral profile of the lamp stored in a memory of the tunable light module.

At step 708, the control circuitry can send the spectral profile to an external device (e.g., the wireless controller 406B of FIG. 4) to be delivered to a cloud server (e.g., the computer server 424 of FIG. 4) associated with the color mixing plan. The cloud server can store a lamps color space map (e.g., the lamps color space map 214 of FIG. 2A). In some embodiments, based on the spectral profile received at the cloud server, the cloud server can update the lamps color space map at step 710. Whether to execute step 710 can depend on the quality of the light sensor used at step 704. In most cases, the light sensor used is not of a high enough quality to warrant an update to the lamps color space map that was built using powerful spectrum analyzer(s).

The cloud server can update the color mixing plan based on the spectral profile of the degradation at step 712. For example, the cloud server can use the updated lamps color space map. For another example, the cloud server can use the spectral profile to identify a tristimulus shift in the lamps color space map and realign the lamps color space map. Once the lamps color space map is updated or realigned, the color mixing plan can be updated using the (updated or realigned) lamps color space map.

When updating the color mixing plan, the cloud server can utilize the same set of constraints (e.g., on performance metrics) used to compute the original color mixing plan. Alternatively, the cloud server can receive a new set of constraints and update the color mixing plan using the new set of constraints. In some embodiments, where the original constraints cannot be met, the cloud server can determine a new set of constraints based on a ranking of priority of the performance metrics. At step 714, the tunable light module can receive the updated color mixing plan back from the cloud server.

While processes or blocks are presented in a given order, alternative embodiments may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed in parallel, or may be performed at different times.

Figure 8:
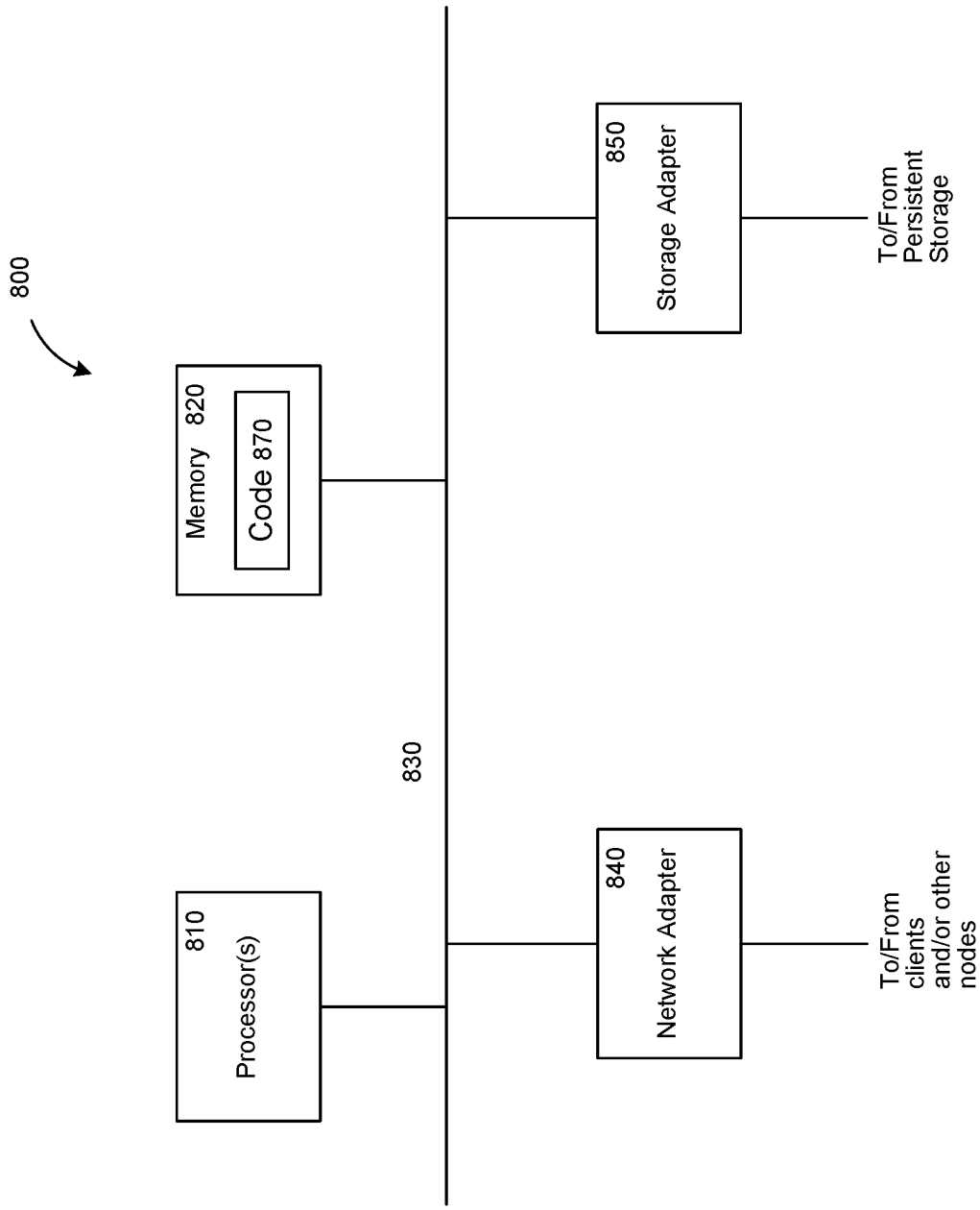
FIG. 8 is a diagrammatic representation of a machine in the example form of a computer system within which a set of instructions, for causing the machine to perform any one or more of the methodologies or modules discussed herein, may be executed.

FIG. 8 is a block diagram of an example of a computing device 800, which may represent one or more computing device or server described herein, in accordance with various embodiments. The computing device 800 can represent the wired controller 406A, the wireless controller 406B or the computer server 424 of FIG. 4. The computing device 800 includes one or more processors 810 and memory 820 coupled to an interconnect 830. The interconnect 830 is an abstraction that represents any one or more separate physical buses, point-to-point connections, or both connected by appropriate bridges, adapters, or controllers. The interconnect 830, therefore, may include, for example, a system bus, a Peripheral Component Interconnect (PCI) bus or PCI-Express bus, a HyperTransport or industry standard architecture (ISA) bus, a small computer system interface (SCSI) bus, a universal serial bus (USB), IIC (I2C) bus, or an Institute of Electrical and Electronics Engineers (IEEE) standard 1394 bus, also called "Firewire".

The processor(s) 810 is/are the central processing unit (CPU) of the computing device 800 and thus controls the overall operation of the computing device 800. In certain embodiments, the processor(s) 810 accomplishes this by executing software or firmware stored in memory 820. The processor(s) 810 may be, or may include, one or more programmable general-purpose or special-purpose microprocessors, digital signal processors (DSPs), programmable controllers, application specific integrated circuits (ASICs), programmable logic devices (PLDs), trusted platform modules (TPMs), or the like, or a combination of such devices.

The memory 820 is or includes the main memory of the computing device 800. The memory 820 represents any form of random access memory (RAM), read-only memory (ROM), flash memory, or the like, or a combination of such devices. In use, the memory 820 may contain a code 870 containing instructions according to the mesh connection system disclosed herein.

Also connected to the processor(s) 810 through the interconnect 830 are a network adapter 840 and a storage adapter 850. The network adapter 840 provides the computing device 800 with the ability to communicate with remote devices, over a network and may be, for example, an Ethernet adapter or Fibre Channel adapter. The network adapter 840 may also provide the computing device 800 with the ability to communicate with other computers. The storage adapter 850 allows the computing device 800 to access a persistent storage, and may be, for example, a Fibre Channel adapter or SCSI adapter.

The code 870 stored in memory 820 may be implemented as software and/or firmware to program the processor(s) 810 to carry out actions described above. In certain embodiments, such software or firmware may be initially provided to the computing device 800 by downloading it from a remote system through the computing device 800 (e.g., via network adapter 840).

The techniques introduced herein can be implemented by, for example, programmable circuitry (e.g., one or more microprocessors) programmed with software and/or firmware, or entirely in special-purpose hardwired circuitry, or in a combination of such forms. Special-purpose hardwired circuitry may be in the form of, for example, one or more application-specific integrated circuits (ASICs), programmable logic devices (PLDs), field-programmable gate arrays (FPGAs), etc.

Software or firmware for use in implementing the techniques introduced here may be stored on a machine-readable storage medium and may be executed by one or more general-purpose or special-purpose programmable microprocessors. A "machine-readable storage medium", as the term is used herein, includes any mechanism that can store information in a form accessible by a machine (a machine may be, for example, a computer, network device, cellular phone, personal digital assistant (PDA), manufacturing tool, any device with one or more processors, etc.). For example, a machine-accessible storage medium includes recordable/non-recordable media (e.g., read-only memory (ROM); random access memory (RAM); magnetic disk storage media; optical storage media; flash memory devices; etc.), etc.

The term "logic", as used herein, can include, for example, programmable circuitry programmed with specific software and/or firmware, special-purpose hardwired circuitry, or a combination thereof.

Some embodiments of the disclosure have other aspects, elements, features, and steps in addition to or in place of what is described above. These potential additions and replacements are described throughout the rest of the specification. In some embodiments, an LED-based lamp drives an LEDs array to flash color sets of the LEDs array in succession. The LED-based lamp can then measure color intensities for each of the color sets with an optical sensor in the light source. A logic unit (e.g., a processor or a controller) of the LED-based lamp can calculate a color ratio between two of the color intensities including a baseline color intensity of a baseline color set. By comparing the color ratio with a factory recalibration setting ratio stored on a memory, the logic unit can adjust a driving current to the baseline color set of the LEDs array to return the color ratio to the factory recalibration setting ratio.

What is claimed is:

1. A tunable light module, comprising:
   a memory storing a color mixing plan;
   a lamp of a color;
   a light sensor configured to measure a light characteristic of the lamp; and
   control circuitry configured to:
   drive the lamp to produce a colored light according to the color mixing plan that corresponds to a correlated color temperature (CCT);

cause the light sensor to measure a light characteristic of the lamp;

detect a degradation level by comparing the measured light characteristic against an expected light characteristic stored in the memory, the expected light characteristic being part of the color mixing plan;

adjust a current level for driving the lamp at the CCT by referencing the color mixing plan and an alternative coefficient corresponding to the degradation level; and in response to determining that the detected degradation level has no pre-computed alternative coefficient saved in the memory, interpolate between alternative coefficients associated with nearby degradation levels proximate to the detected degradation level to derive the alternative coefficient used to adjust the current level, wherein the color mixing plan specifies a driving condition for the lamp to achieve a color characteristic at a particular operational temperature.

2. The tunable light module of claim 1, wherein the alternative coefficient is pre-computed, part of the color mixing plan, and stored in the memory, and wherein the alternative coefficient is associated with the detected degradation level prior to deployment of the tunable light module.

3. The tunable light module of claim 1, wherein the light characteristic is brightness of the colored light.

4. The tunable light module of claim 1, further comprising:

computing the alternative coefficients for the color mixing plan for the degradation level; and storing the alternative coefficients in the memory prior to deployment of the tunable light module such that the tunable light module is capable of being calibrated after the deployment.

5. The tunable light module of claim 1, wherein the color mixing plan is a lookup table that maps correlated color temperature to driving current levels or output flux requirements for the lamp, and wherein the driving current levels or the output flux requirements are represented by the alternative coefficients.

6. The tunable light module of claim 1, wherein the color mixing plan is a polynomial function that takes a correlated color temperature as an input and provides driving current levels or output flux requirements for the lamp, and wherein the alternative coefficients are coefficients of the polynomial function.

7. A tunable light module, comprising:
a lamp of a color;
a memory storing a color mixing plan specifying a driving condition for the lamp to achieve a color characteristic at a particular operational temperature;
a light sensor configured to measure a light characteristic of the lamp; and
control circuitry configured to:
drive the lamp to produce a colored light according to the color mixing plan that corresponds to a correlated color temperature (COT);
cause the light sensor to measure the light characteristic of the lamp;
detect a degradation level by comparing the measured light characteristic against an expected light characteristic stored in the memory; and
adjust a current level for driving the lamp at the CCT by referencing the color mixing plan and an alternative coefficient corresponding to the degradation level,
wherein the color mixing plan maps operational temperature of the lamp to one or more driving conditions.

8. The tunable light module of claim 7, further comprising:
a temperature sensor configured to measure or approximate the operating temperature of the lamp.

9. The tunable light module of claim 7, wherein the control circuitry is further configured to retrieve the alternative coefficient from the memory.

10. The tunable light module of claim 7, wherein the control circuitry is further configured to:
determine that the degradation level does not correspond to any pre-computed alternative coefficient stored in the memory;
retrieve a pair of pre-computed alternative coefficients from the memory, the pair of pre-computed alternative coefficients comprising:
a first pre-computed alternative coefficient corresponding to a next highest degradation level; and
a second pre-computed alternative coefficient corresponding to a next lowest degradation level; and
deriving the alternative coefficient by interpolating between the pair of pre-computed alternative coefficients.

11. The tunable light module of claim 7, wherein the control circuitry is further configured to store the alternative coefficient in the memory.

12. A tunable light module, comprising:
a lamp of a color;
a memory storing a color mixing plan;
a light sensor configured to measure a light characteristic of the lamp; and
control circuitry configured to:
drive the lamp to produce a colored light according to the color mixing plan that corresponds to a correlated color temperature (COT);
cause the light sensor to measure the light characteristic of the lamp;
detect a degradation level by comparing the measured light characteristic against an expected light characteristic stored in the memory;
adjust a current level for driving the lamp at the CCT by referencing the color mixing plan and an alternative coefficient corresponding to the degradation level;
generate a spectral profile based on the colored light produced by the lamp as measured by the light sensor; and
transmit the spectral profile to a server across a network.

13. The tunable light module of claim 12, wherein, upon receipt of the spectral profile, the server is configured to:
realign a color space map associated with the lamp, the color space map comprising test data for the lamp prior to deployment of the tunable light module;
update the color mixing plan based on the realigned color space map by optimizing the color mixing plan against a set of performance metric constraints on illumination produced by the lamp;
send the updated color mixing plan to the tunable light module.

14. The tunable light module of claim 12, wherein the causing the light sensor to measure the light characteristic of the lamp comprises monitoring the spectral profile of the lamp using the light sensor, wherein the detecting the degradation level comprises detecting a degradation in the lamp based on the spectral profile, and wherein, due to the degradation, the tunable light module is unable to produce illumination with the lamp at the CCT that satisfies a set of performance metric constraints of the illumination according to the color mixing plan.

15. The tunable light module of claim 14, wherein the control circuitry is further configured to:

send the spectral profile to an external device for delivery to a cloud server; and receive an updated color mixing plan back from the cloud server, wherein the tunable light module is able to produce illumination at the CCT that satisfies the set of performance metric constraints according to the updated color mixing plan.

16. The tunable light module of claim 14, wherein the performance metric constraints comprise illumination efficiency, illumination efficacy, color rendering index, maximum lumens, or any combination thereof.

17. The tunable light module of claim 12, wherein the light sensor is a tristimulus sensor or a spectral analyzer.

18. The tunable light module of claim 12, further comprising a communication interface capable of sending a wireless signal to a mobile device that has a network connection to a cloud server, and wherein the communication interface is configured to embed the spectral profile in the wireless signal that is designated with a destination at the cloud server.

* * * * *

UNITED STATES PATENT AND TRADEMARK OFFICE
CERTIFICATE OF CORRECTION

PATENT NO.        : 10,772,174 B2                                  Page 1 of 1
APPLICATION NO.   : 16/208242
DATED             : September 8, 2020
INVENTOR(S)       : Matthew D. Weaver It is certified that error appears in the above-identified patent and that said Letters Patent is hereby corrected as shown below:

In the Claims

Column 19, Line 62, Claim 7    delete "COT" and insert -- CCT --

Column 20, Line 42, Claim 12   delete "COT" and insert -- CCT --

Signed and Sealed this
Twenty-seventh Day of July, 2021

Drew Hirshfeld
*Performing the Functions and Duties of the*
*Under Secretary of Commerce for Intellectual Property and*
*Director of the United States Patent and Trademark Office*